United States Patent
Iwamuro et al.

(10) Patent No.: US 6,469,344 B2
(45) Date of Patent: *Oct. 22, 2002

(54) SEMICONDUCTOR DEVICE HAVING LOW ON RESISTANCE HIGH SPEED TURN OFF AND SHORT SWITCHING TURN OFF STORAGE TIME

(75) Inventors: Noriyuki Iwamuro, Nagano (JP); Yuichi Harada, Nagano (JP)

(73) Assignee: Fuji Electric Co., Ltd. (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/461,264

(22) Filed: Dec. 15, 1999

(65) Prior Publication Data

US 2002/0053696 A1 May 9, 2002

(30) Foreign Application Priority Data

Dec. 15, 1998 (JP) .............................. 10-355943

(51) Int. Cl.$^7$ ......................... H01L 29/76; H01L 29/74; H01L 31/111; H01L 29/94
(52) U.S. Cl. ....................... 257/330; 257/139; 257/140; 257/146; 257/147; 257/341
(58) Field of Search ................................ 257/329, 330, 257/331, 334, 135, 133, 139, 147, 138

(56) References Cited

U.S. PATENT DOCUMENTS

| 4,994,871 A |   | 2/1991 | Chang et al. ............... 357/23.4 |
| 5,448,083 A | * | 9/1995 | Kitagawa et al. ............ 257/138 |

FOREIGN PATENT DOCUMENTS

| JP | 7-135309 |   | 5/1995 | ................. 257/330 |
| JP | 10-256550 | * | 9/1998 | ................. 257/330 |

OTHER PUBLICATIONS

4500 VIEGTs Having Switching Characteristics Superior to GTO, Kitagawa et al., Proceedings of 1995 International Symposium on Power Semiconductor Devices & ICs, Yokohama, pp. 486–491.

"High Turn–off Current Capability of Parallel–connected 4.5kV Trench–IEGTs"; Tsuneo Ogura et al.; International Symposium on Power Semicondutor Devices & IC's; New York, NY; IEEE; Jun. 3, 1998; pp. 47–50; XP000801033.

"4500 V IEGTs having Switching Characteristics Superior to GTO"; Mitsuhiko Kitagawa et al.; Proceedings of 1995 International Symposium on Power Semiconductor Devices & ICs, Yokohama, Japan; pp. 486–491.

(List continued on next page.)

Primary Examiner—Steven Loke
(74) Attorney, Agent, or Firm—Rossi & Associates

(57) ABSTRACT

A semiconductor device is provided which includes a first p base region and a second p base region formed in one of opposite surface of a high-resistance n base region, a p collector region formed on the other surface of the n base region, an n emitter region formed in a surface layer of the first p base region, and a groove formed in the n base region between the first and second p base regions, to provide a trench gate electrode portion. The first and second p base regions are formed alternately in the Z-axis direction with certain spacing therebetween. The second p base region is held in a floating state in terms of the potential, thus assuring a reduced ON-resistance, and a large quantity of carriers present in the vicinity of the surface of the second p base region are quickly drawn away through a p channel upon turn-off, so that the turn-off time is reduced.

10 Claims, 9 Drawing Sheets

OTHER PUBLICATIONS

"Advanced Lifetime Control for Reducing Turn–Off Switching Losses of 4.5kV IEGT Devices"; Simon Eicher et al.; Proceedings of 1998 International Symposium on Power Semiconductor Devices & ICs, Kyoto, Japan; pp. 39–42.

"High Turn–off Current Capability of Parallel–connected 4.5 kV Trench–IEGTs"; Tsuneo Ogura et al.; Proceedings of 1998 International Symposium on Power Semiconductor Devices & ICs, Kyoto, Japan; pp. 47–50.

"MOS Controlled Thyristors (MCT's)"; V.A.K. Temple; IEDM 84; 1984 pp. 282–285.

"High–Voltage Current Saturation in Emitter Switched Thyristors"; M.S. Shekar et al.; IEEE Electron Device Letters, vol. 12, No. 7; Jul. 1991; pp. 387–389.

"A Study of EST's Short–Circuit SOA"; N. Iwamuro et al.; 5th International Symposium on Power Semiconductor Devices and IC's; IEEE 1993; pp. 71–76.

"Comparison of RBSOA of ESTs with IGBTs and MCTS"; N. Iwamuro et al.; Proceedings of the 6th International Symposium on Power Semiconductor Devices & IC's, Davos, Switzerland; May 31–Jun. 2, 1994; IEEE Cat. No. 94CH3377–9; pp. 195–200.

* cited by examiner

US 6,469,344 B2

SEMICONDUCTOR DEVICE HAVING LOW ON RESISTANCE HIGH SPEED TURN OFF AND SHORT SWITCHING TURN OFF STORAGE TIME

FIELD OF THE INVENTION

The present invention relates to semiconductor devices used as insulated gate switching devices.

BACKGROUND OF THE INVENTION

Thyristors have been used as indispensable devices for large capacity power switching owing to the low ON-state voltage characteristic. Gate Turn-Off (GTO) thyristors, for example, are widely used in these days in high-voltage large-current range applications. The GTO thyristor, however, has revealed drawbacks as follows: (1) large gate current is required for turning off the device, and (2) a large-sized snubber is needed to safely turn off the GTO thyristor. In addition, since the GTO thyristor does not show current saturation in its current-voltage characteristic, a passive component, such as a fuse, must be coupled to the thyristor so as to protect a load from short-circuiting. This greatly impedes the reduction in the size and cost of the whole system.

In 1984, MOS controlled thyristor (hereinafter abbreviated to MCT) as a voltage-driven type thyristor was proposed by Temple et al. of General Electric in IEEE IEDM Tech. Dig., pp.282 (1984). Since then, the characteristics of this type of thyristor have been analyzed and improved in various institutions worldwide. This is because the MCT, which is a voltage-drive type device, requires a far simpler gate circuit than the GTO thyristor, while assuring a relatively low ON-state voltage characteristic. The MCT, however, does not show a current saturation characteristic as in the case of the GTO thyristor, and therefore requires a passive component, such as a fuse, in practical use.

In the meantime, U.S. Pat. Nos. 4,847,671 and 4,502,070 disclose semiconductor devices having current saturation characteristics, wherein a thyristor is connected in series with MOSFET. These known devices, however, show effective saturation characteristics only where a low voltage is applied thereto, and may break down if a voltage that is equal to or higher than the breakdown voltage of the MOSFET connected in series is applied to the anode. To solve this problem, M. S. Sheker and others disclosed a dual channel type emitter switched thyristor (EST) in IEEE Electron Device Letters, vol. 12, pp.387 (1991), and proved through actual measurements that this type of device shows a current saturation characteristic even in a high voltage range. Subsequently, Iwamuro et al. presented results of their analysis on a forward bias safe operation area (FBSOA) and a reverse bias safe operation area (RBSOA) of the EST in ISPSD '93, pp.71, (1993) and ISPD '94, pp195 (1994), and paved the way to the development of voltage-driven type thyristors having safe operation areas in which the device operates safely when a load is short-circuited. Device structures similar to the EST are also disclosed in U.S. Pat. Nos. 5,381,026 and 5,464,994.

Kitagawa et al. disclosed in laid-open Japanese Patent Publication (Kokai) No. 7-50405 IEGT (Injection Enhanced Gate Transistor) that employs a gate trench structure in a voltage-driven type transistor structure, so as to achieve carrier distribution that is close to that which appears in the operation of thyristors. While the basic operation of this device is exactly the same as that of IGBT (Insulated Gate Bipolar Transistor), a portion of the surface of the device through which current passes is given a smaller area than that of IGBT, so as to raise the resistance and vary the carrier distribution inside the device to a greater extent, in particular, increase the carrier concentration at the surface of the device. To this end, the width of the trench portion may be made greater than that of the mesa portion. In the actual fabrication of such a device that has a large trench width, however, it is difficult to uniformly embed polysilicon in the inside of the trench, or the shape of the trench is undesirably changed. Thus, the current manufacturing level only permits formation of a trench having a width up to about 1.5 $\mu$m. To solve this problem, Kitagawa et al. proposed in ISPSD '95, pp.486 (1995) a device having narrow trench gate electrodes and p regions held in a floating state in terms of the potential, which are formed alternately, so as to provide the same effect as provided by the device having a large trench width. Similar devices are also disclosed by Kitagawa et al. in ISPSD '95, pp. 486 (1995), S. Eicher et al. in ISPSD '98, pp. 39 (1998), and Ogawa et al. in ISPSD '98, pp. 47 (1998).

The above-described devices are characterized by employing the thyristor structure or trench structure so that the carrier concentration is raised or increased only at the surface of the device, thereby to lower the resistance upon turn-on of the device. Upon turn-off, the carrier distribution of its portion where a depletion layer has spread out is not varied, so that the turn-off loss is reduced, thus enabling the device to achieve a high-speed characteristic equivalent to that of IGBT. Thus, the known devices attempt to lower the ON-state voltage than that of the IGBT, while achieving substantially the same turn-off speed. During the turn-off operation before the depletion layer spread out, however, the carrier concentration is high at the surface of the device as in the ON duration, and the portion of the surface of the device through which current passes is reduced, which results in a slow rate at which a large quantity of carriers present at the surface of the device are drawn away. Accordingly, the turn-off storage time is increased. In view of this situation, Kitagawa et al. proposed a trench IEGT as disclosed in laid-open Patent Publication (Kokai) No. 7-135309, wherein a hole is provided for allowing carriers to be drawn away from a p region that is in a floating state in terms of the potential, through MOSFET, so that the switching speed is increased. The structure of the trench IEGT as disclosed in laid-open Patent Publication 7-135309 will be now described in detail.

FIG. 7 is a perspective view showing cross sections of a principal part of the trench IGBT as one type of known device. In the device of FIG. 7, a first p base region 74 and a second p base region 75 are formed in a surface layer of an n base region 73, and a plurality of n source regions 76 are formed in a surface layer of the first p base region 74 such that the regions 76 are spaced apart from each other. A trench is formed which extends from the surface of the device to a certain depth, and a gate electrode 78 is formed in the trench with a gate insulating film 77 interposed between the gate electrode 78 and the inner wall of the trench.

A cathode electrode 82 is formed on the surface of the first p base region 74 and the n source regions 76. The second p base region 75 extends continuously in the Z-axis direction, until one end of the region 75 reaches an n base region 87 as part of the n base region 73. Also, a p$^+$region 88 is formed outwardly of the n base region 87. The p$^+$region 88 is connected to the first p base region 74. It is to be understood that the n base region 87 is a portion of the n base region 73 that is interposed between the second p base region 75 and the p$^+$region 88.

The trench extends in the Z-axis direction until it reaches the p+region 88, and the cathode electrode 82 is formed on the surface of the p+region 88. A p emitter region 71 is formed on the rear surface of the n base region 73, and an anode electrode 83 is formed on the surface of the p emitter region 71. The anode electrode 83, cathode electrode 82, and the gate electrode 78 are connected to an anode terminal A, cathode terminal K and a gate terminal G, respectively. It is to be noted that the n source region 76, p emitter region 71, cathode electrode 82, anode electrode 83, cathode terminal K and the anode terminal A respectively correspond to an n emitter region, p collector region, emitter electrode E, collector electrode C, emitter terminal E and a collector terminal C, which will be described later in preferred embodiments of the present invention. In the trench IEGT as disclosed in laid-open Japanese Patent Publication (Kokai) No. 7-135309, n source regions 76 and p+regions are formed alternately in the surface layer of the first p base region 74, and a p+region is formed in the surface layer of the second p base region 75. In the trench IEGT shown in FIG. 7, on the other hand, the first p base region 74 and second p base region 75 are to be considered as incorporating these p+regions. While the first p base region is formed as a lower layer of the p+region 88 in the EGT disclosed in the above-identified publication, the p+region 88 as shown in FIG. 7 is regarded as incorporating the first p base region.

In the above trench IEGT, the gate electrodes 78 having a narrow trench structure and the second base regions 75 that are in a floating state in terms of the potential are formed alternately in the X-axis direction, so that the area of a surface portion through which current passes is reduced as compared with that of the IGBT, whereby the carrier distribution inside the device varies to a great extent, namely, the carrier concentration at the surface of the device is increased, with a result of reduced resistance upon turn-on of the device. Upon turn-off, the carrier distribution is not varied after a depletion layer spreads out, so that the turn-off loss and turn-off time are reduced, and the IEGT achieves a high-speed switching characteristic equivalent to that of the IGBT.

During a turn-off operation of the above trench IGBT before the depletion layer spreads out, however, the carrier concentration at the device surface is relatively high as is during turn-on, and the current passes through a relatively small area of the surface portion (that corresponds to the area of contact holes). Furthermore, carriers present in the second p base region 75 and the p+region 88 formed in the surface layer of the second p base region 75 flow into the first p base region 74 and the p+region 88, only through a p channel 90 formed in the n base region 73 at the bottom and part of side faces of the trench, and a p channel 89 formed in the n base region 87 along side walls of the trench located at the opposite ends of the second p base region 75 as viewed in the Z-axis direction (only one of the opposite ends is illustrated in FIG. 7).

The p channel 90 as described above has a relatively large channel length, namely, provides a long current path. While the p channel 89 formed along the side wall of the trench has a small channel length, the carriers that have been accumulated in the second p base region 75 formed continuously in the Z-axis direction must be drawn away through the p channels 89 at the opposite ends of the region 75, resulting in an increased density of carriers flowing through the channel.

As described above, carriers must be drawn away through a long channel (90) formed at the bottom portion of the trench. Alternatively, carriers must be drawn away through a channel (89) formed along the side wall of the trench, with a high carrier density. Thus, it takes time to draw away a large quantity of carriers present at the device surface, irrespective of which path or channel is used for drawing away the carriers, resulting in an increase in the turn-off storage time. Also, the p+region 88 needs to be provided for allowing carriers to be drawn away, but current does not flow through the p+region 88 while the device is in the ON state. Thus, the p+region 88 provides useless space upon turn-on, and therefore the ON-state voltage (ON resistance) of the device is increased.

SUMMARY OF THE INVENTION

It is an object of the present invention to provide a semiconductor device that assures both low ON resistance and high-speed turn-off characteristic, and also has a switching characteristic with a short turn-off storage time.

To accomplish the above object, the present invention provides a semiconductor device, comprising: a first-conductivity-type first base region; a gate electrode formed on a gate insulating film within a groove that is formed in a selected elongate portion of a surface layer of the first base region; a second-conductivity-type second base region formed in a selected portion of the surface layer of the first base region, such that the second base region has a smaller depth than the groove, and is located adjacent to the groove; a source region formed in a selected portion of a surface layer of the second base region, to be located adjacent to the groove; a second-conductivity-type third base region that is formed in a selected portion of the surface layer of the first base region, apart from the second base region, to be located adjacent to the groove; a first main electrode formed in contact with the source region and the second base region; a collector region formed in a rear surface layer of the first base region; and a second main electrode formed on the collector region, wherein the second base region and the third base region are alternately formed on at least one of side faces of the groove in a longitudinal direction of the groove.

In one preferred form of the invention, the second base region and the third base region are formed on the opposite sides of the groove as viewed in the longitudinal direction thereof In another preferred form of the invention, the second base region and the third base region are opposed to each other with the groove located therebetween.

In the semiconductor device of the present invention as described above, the second base region is located adjacent to the third base region that is in a floating state in terms of the potential, and the two base regions, i.e., the second and third base regions, cooperate with the gate insulating film and the gate electrode to constitute a gate electrode portion. In operation, an inversion layer is formed in the first base region right under the gate electrode, so that the second base region and the third base region are connected with each other and have the same potential. In this state, carriers accumulated in the vicinity of the surface of the device flow through the inversion layer from the third base region, to be drawn away through the second base region, so that the device can be immediately turned off. Further, the second base region and the third base region are formed alternately in the longitudinal direction of the device with certain spacing therebetween, so that carriers are also drawn away in the longitudinal direction through an inversion layer formed at the interface of the first base region located along a side wall of the trench gate electrode. Since the second base region also serves as a p+layer for carriers as required in the IEGT proposed by Kitagawa et al., there is no particular need to provide such a p+layer, and the effective area of the chip can be accordingly increased, with a result of an even smaller ON resistance than that of the IEGT.

In a further preferred form of the invention, a first-conductivity-type fourth base region having lower resistance than the first base region is formed between the rear surface of the first base region and the collector region.

With the fourth base region (that is generally called "buffer region") thus provided, the thickness of the first base region can be reduced, thus making it easy for the device to provide a higher breakdown voltage. Furthermore, where the device is a 600V-class device with a medium breakdown voltage, the tradeoff between the saturation voltage and the turn-off characteristic can be improved as compared with the case where no buffer region is provided.

It is preferable to drive the semiconductor device of the present invention such that a first-conductivity-type channel is formed in the second base region upon turn-on, and a second-conductivity-type channel is formed in the first base region upon turn-off.

More specifically described, a positive voltage is applied to the gate electrode to turn on the device, so that the first-conductivity-type channel is formed in the second base region, and a negative voltage is applied to the gate electrode to turn off the device, so that the second-conductivity-type channel is formed in the first base region.

Thus, positive or negative voltage is selectively applied to the gate electrode, so as to easily turn on or off the semiconductor device. As described above, the second-conductivity-type channel is formed upon turn-off in the first base region that is in contact with the side wall of the trench, and therefore carriers in the vicinity of the third base region can be efficiently drawn away into the second base region, assuring an improved tradeoff between the saturation voltage and turn-off characteristics.

It may also be possible to drive the semiconductor device by reversing the polarity of the voltage applied to between the gate electrode and the first main electrode upon turn-on and turn-off.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

Some preferred embodiments of the present invention will be described in detail with reference to the drawings. While the first conductivity type is n type and the second conductivity type is p type in the following embodiments, the conductivity types may be reversed.

Figure 1:
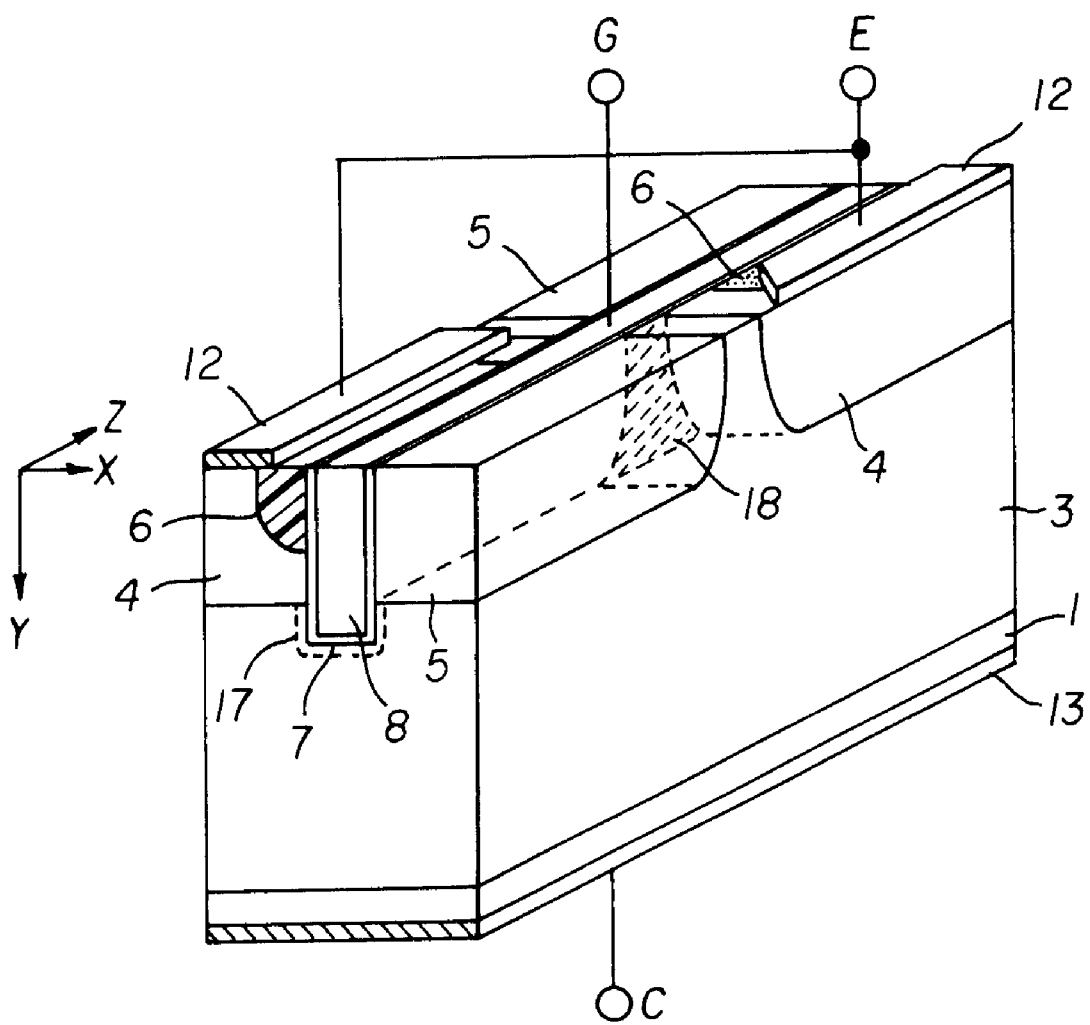
FIG. 1 is a perspective view showing cross sections of a principal part of a semiconductor device according to the first embodiment of the present invention.

FIG. 1 is a perspective view showing cross sections of a principal part of a semiconductor device according to the first embodiment of the present invention. In the semiconductor device of FIG. 1, a plurality of 5 μm-thickness p regions that will provide first p base regions 4 and second p base regions 5 are formed in one surface of an n base region 3 having high resistance, such that these p regions are arranged at intervals of 1.5 μm in a surface portion of the device, and a p collector region 1 is formed on the other surface of the n base region 3. An n emitter region 6 is formed in the surface of each of the first p base regions 4, and a groove that has a width of 1.5 μm and a thickness of 6 μm and reaches the n base region 3 is formed in the above-indicated plural p regions, so as to divide each of the p regions into the first p base region 4 and the second p base region 5. The groove is formed such that the n emitter regions 6 are not located on the side of the p base regions 5. A gate insulating film 7 is formed along the inner wall of the groove, and a gate electrode 8 is formed so as to fill the groove. The gate oxide film 7 and gate electrode 8 thus formed in the groove constitute a gate electrode portion of a trench structure.

After the emitter-side surface of the device on which the above-indicated regions and gate electrode 8 are formed are covered with an interlayer insulating film that is not illustrated, contact holes are formed such that the surfaces of the first p base regions 4 and emitter regions 6 are exposed to the outside through the holes, and emitter electrodes 12 are then formed in the contact holes for contact with the first p base regions 4 and emitter regions 6. A p collector region 1 is formed on the rear surface of the n base region 3, and a collector electrode 13 is formed on the surface of the p collector region 1. As viewed in the Z-axis direction in FIG. 1, each of the first p base regions 4 with the n emitter region 6 formed in its surface layer and a corresponding one of the second p base regions 5 are formed on the opposite sides of the gate electrode portion having a trench structure. As viewed in the X-axis direction, the first p base regions 4 each having the n emitter region 6 formed in its surface layer and the second p base regions 5 are alternately formed while being spaced from each other.

The operation of the semiconductor device thus constructed will now be described. When a positive voltage is applied to the gate electrode 8 while the emitter electrode 12 is being grounded and a positive voltage is being applied to the collector electrode 13, an inversion layer is formed at the interface of the first p base region 4 that is in contact with the gate insulating film 7, and an accumulation layer is formed at the interface of the n base region 3. The inversion layer formed at the interface of the first p base region 4 provides an n channel. As a result, an n channel MOSFET that consists of the n emitter region 6, first p base region 4, n base region 3, gate insulating film 7 and the gate electrode is turned on.

Upon turn-on of the n channel MOSFET, electrons are supplied from the emitter electrode 12 to the n base region 3 through the n emitter region 6 and the channel of the n channel MOSFET. These electrons serve as base current of a pnp transistor that consists of the first and second p base regions 4, 5, n base region 3 and the p collector region 1, thus permitting the pnp transistor to operate. To turn off the n channel MOSFET, the potential of the gate electrode 8 is lowered to be smaller than a threshold value of the n channel MOSFET, so that no electrons are supplied from the n emitter region 6. As a result, the pnp transistor is brought into the OFF state, and the semiconductor device is turned off.

As described above, the basic operation of the device of the present invention is the same as that of IGBT (Insulated Gate Bipolar Transistor). In the following, unique operations of the present device will be now explained.

In the device of the present invention, when a positive voltage is applied to the gate electrode 8, the second p base region 5 that is not connected to the emitter electrode 12 is brought into a floating state in terms of its potential. Accordingly, the current cannot flow into the emitter electrode 12 through the second p base region 5, but flows only through the contact portion of the first p base region 4 and the n emitter region 6, resulting in a reduction in the area of a portion of the surface through which the current flows. Consequently, the carrier distribution at the surface of the device is raised (namely, the carrier concentration is increased), and the ON resistance is reduced.

When a negative voltage is applied to the gate electrode 8 upon turn-off, an inversion layer, i.e., a p channel, is formed in a surface layer of the n base region 3 located below the gate electrode 8, and the second p base region 5 and the first p base region 4 are connected to each other through the p channel, so that the potential of the second p base region 5 becomes equal to that of the first p base region 4. During the initial period of the turn-off operation before a depletion layer spreads out, therefore, a large quantity of carriers that exist in the vicinity of the surface of the second p base region 5 are drawn away into the emitter electrode 12, through the p channel and the first p base region 4. Thus, a p channel MOSFET consisting of the second p base region 5, n base region 3, first p base region 4, gate insulating film 7 and the gate electrode 8 is turned on, with a result of a reduction in the turn-off storage time.

The p channel as described above includes a p channel 17 formed at the bottom and part of side walls of the trench so as to surround the lower part of the trench, and a p channel 18 formed along part of side walls of the trench. When comparing the length of the shortest current path between these two types of p channels, the p channel 17 formed at the bottom and part of side walls of the trench has a length of about 3.5 μm, and the p channel 18 formed along the side wall has a length of about 1.5 μm. Thus, the length of the p channel 18 is smaller than one half of that of the p channel 17. With this arrangement, a considerably large quantity of carriers that have been accumulated in the vicinity of the second p base region 5 enter the first p base region 4 through the side-wall p channel 18, to be drawn away through the emitter electrode 12, which results in a reduction in the turn-off storage time.

As compared with the trench IEGT as disclosed in laid-open Japanese Patent Publication No. 7-135309, the device of the present invention has a relatively large number of p channels formed at side walls, with the result of a reduced density of carriers flowing through the p channels 18, and therefore permits the carriers to be drawn away with high efficiency. Thus, the turn-off storage time of the device of the present invention is shortened as compared with that of the trench IEGT.

Furthermore, the device of the present invention is different from the trench IGBT as disclosed in laid-open Japanese Patent Publication No. 7-135309 in that the present device does not require the p$^+$region 88 exclusively provided for drawing away the carriers into the emitter electrode 12. This is because the first p base region 4 of the present device also performs the function of the p$^+$region 88. Since the p$^+$region 88 provided in the trench IEGT does not perform any function while the device is in the ON state, thus providing a useless or wasteful space, the elimination of the p$^+$region 88 in the present device leads to a significantly improved efficiency in utilizing the area, thus yielding such great effects as a reduction in the chip size and an increase in the current capacity.

In a modified form of the present embodiment, p$^+$regions may be formed in surface layers of the first p base regions 4 and second p base regions 5.

Figure 2:
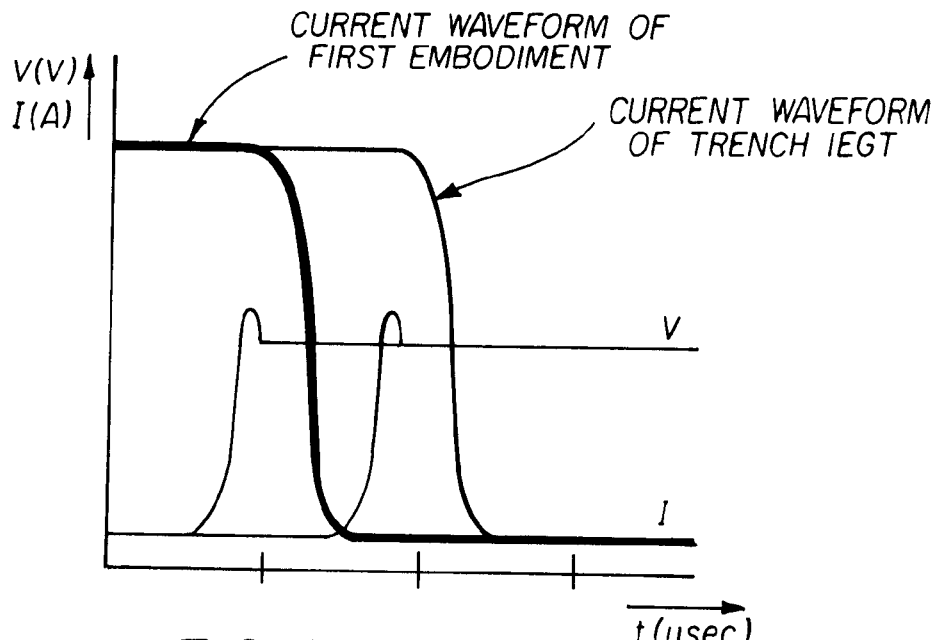
FIG. 2 is a view showing the turn-off waveforms of the device of the present invention as shown in FIG. 1 and a trench IEGT.

FIG. 2 schematically shows the turn-off waveform of the device of the present invention and that of the trench IEGT. In FIG. 2, the horizontal axis indicates time, and the vertical axis indicates the voltage and current waveforms. The thick line represents the waveform of the device of the first embodiment of the invention, and the thin line represents the waveform of the trench IEGT as disclosed in laid-open Japanese Patent Publication No. 7-135309. It will be understood from FIG. 2 that the turn-off time of the device according to the first embodiment of the present invention is shorter than that of the trench IEGT.

Figure 3:
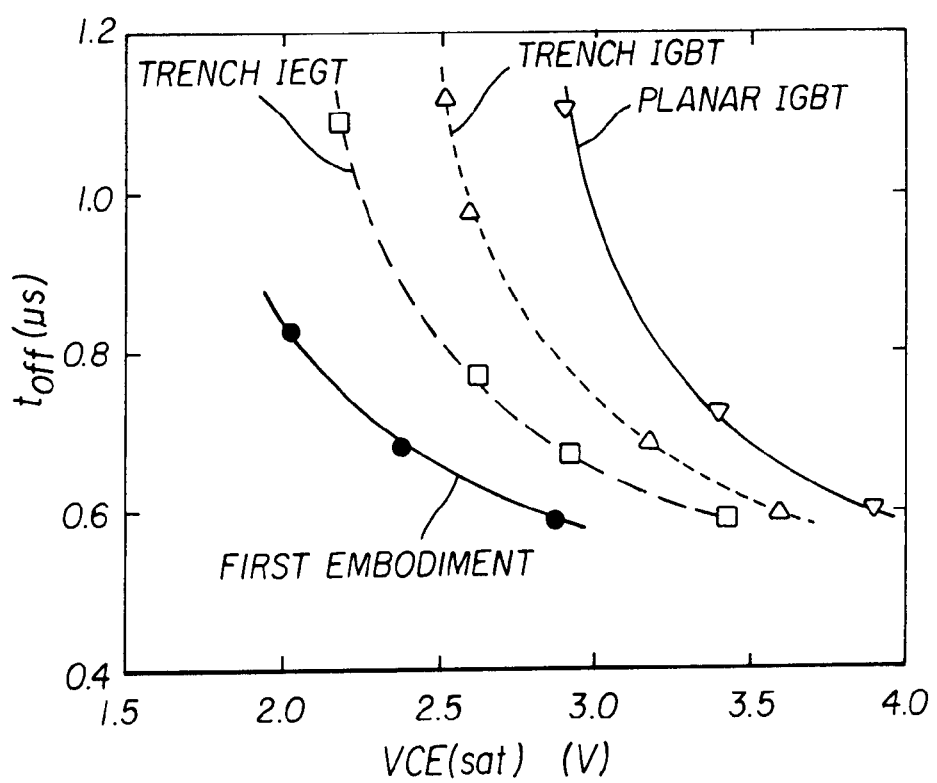
FIG. 3 is a graph showing the tradeoff between the turn-off time and the saturation voltage of the device of the present invention and conventional devices.
Figure 4:
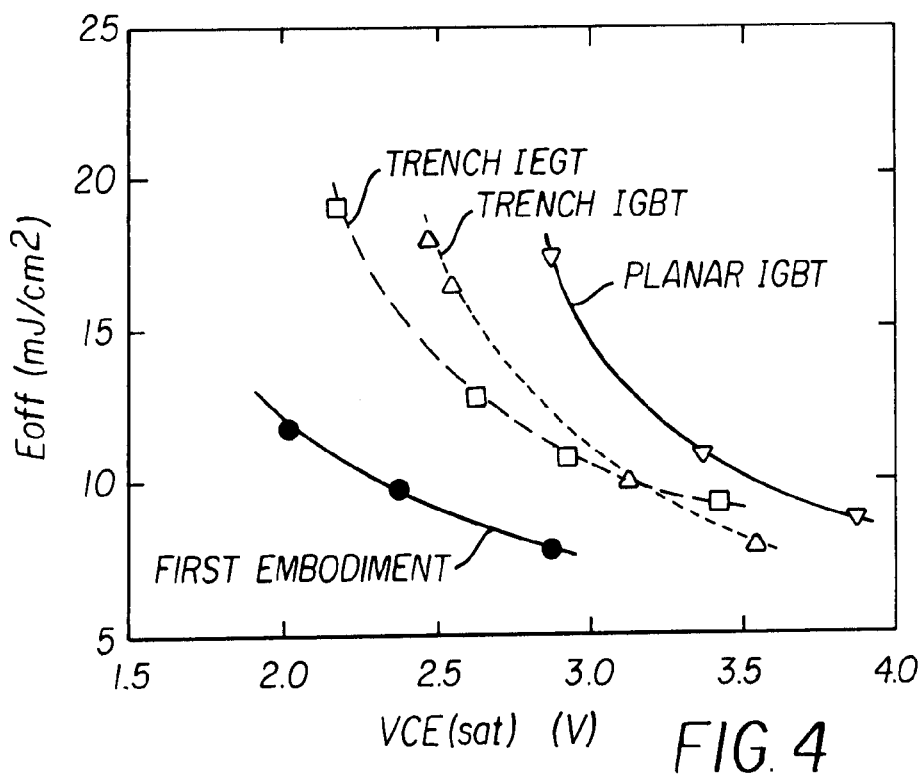
FIG. 4 is a graph showing the tradeoff between the turn-off loss and the saturation voltage of the device of the present invention and conventional devices.
Figure 5:
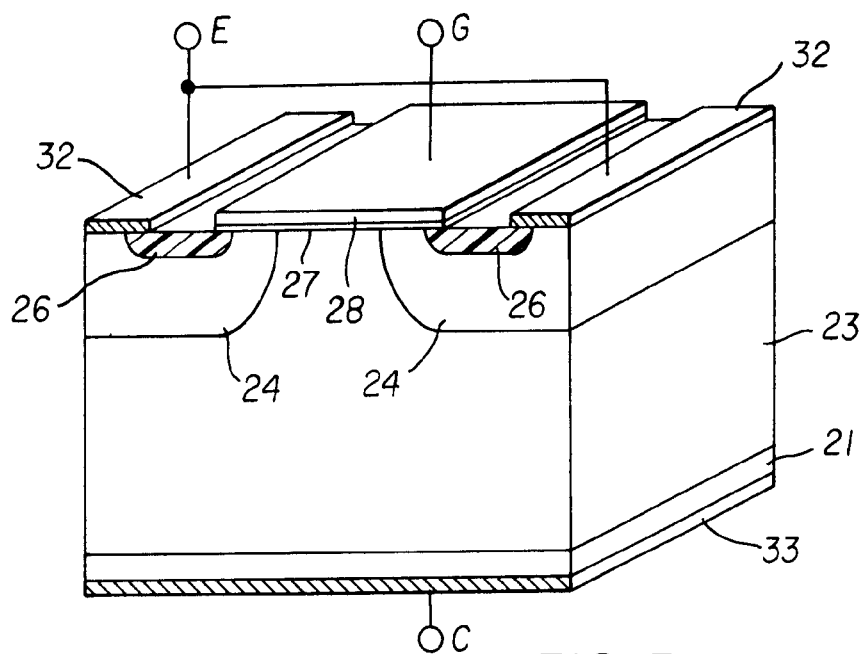
FIG. 5 is a perspective view showing cross sections of a principal part of a planar IGBT.
Figure 6:
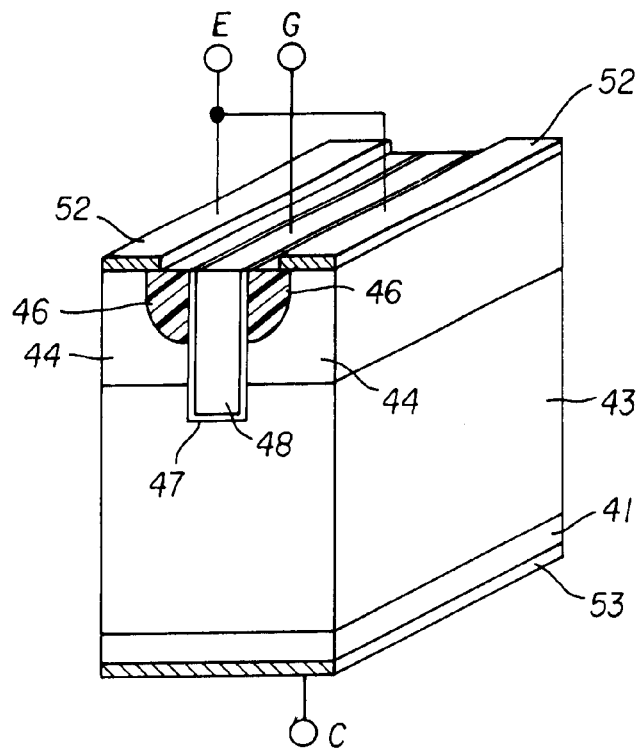
FIG. 6 is a perspective view showing cross sections of a principal part of a trench IGBT.
Figure 7:
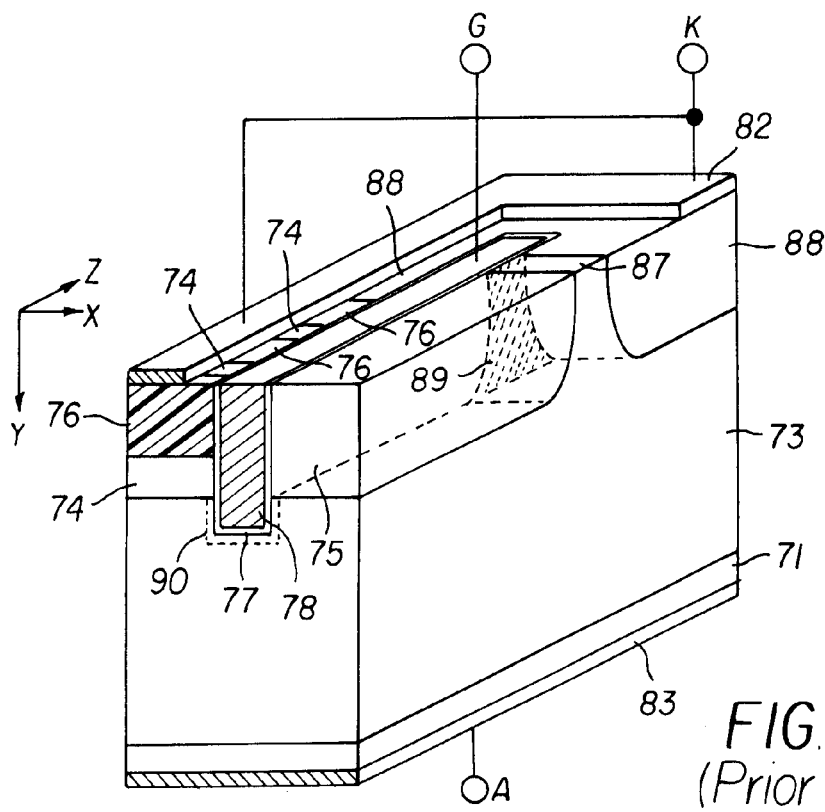
FIG. 7 is a perspective view showing cross sections of a principal part of a trench IEGT as a conventional device.

FIG. 3 and FIG. 4 show the tradeoff between the turn-off time and the saturation voltage and the tradeoff between the turn-off loss and the saturation voltage, respectively, with respect to the device of the present invention and conventional devices. The saturation voltage is also called "ON voltage", which is represented by $V_{CE}$(sat) in the graphs, and $t_{off}$ denotes the turn-off time while $E_{off}$ denotes the turn-off loss. The conventional devices are of three types, i.e., planar IGBT, trench IGBT, and trench IEGT. The breakdown voltage of the present device and the conventional devices is 1200V. It will be understood from FIG. 3 and FIG. 4 that the device of the present invention is more excellent in terms of both the tradeoff between the turn-off time and the saturation voltage, and the tradeoff between the turn-off loss and the saturation voltage. Referring next to FIGS. 5–7, the conventional devices used for comparison with the present device will be now explained.

FIG. 5 is a perspective view showing cross sections of a principal part of the planar IGBT. The planar IGBT as shown in FIG. 5 includes a p collector region 21, n base region 23, p base regions 24, emitter regions 26, gate insulating film 27, gate electrode 28, emitter electrodes 32, collector electrode 33, collector terminal C, emitter terminal E and a gate terminal G.

FIG. 6 is a perspective view showing cross sections of a principal part of the trench IGBT. The trench IGBT as shown in FIG. 6 includes a p collector region 41, n base region 43, p base regions 44, n emitter regions 46, gate insulating film 47, gate electrode 48, emitter electrodes 52, collector electrode 53, collector terminal C, emitter terminal E, and a gate terminal G. FIG. 7 is a perspective view showing cross sections of a principal part of the trench IEGT as described above.

The characteristics of the above devices will be now explained. The planar IGBT as shown in FIG. 5 has a planar gate structure including the regions 26, 24 and 23, gate insulating film 27 and the gate electrode 28. The trench IGBT as shown in FIG. 6 has a trench-type gate structure including the regions 46, 44 and 43, gate insulating film 47, and the gate electrode 48. The trench IEGT of FIG. 7, which has been discussed above, will not explained herein.

A method for manufacturing the device of the present invention and the conventional devices used in the characteristic comparison tests of FIG. 3 and FIG. 4 will be now explained by way of example.

To fabricate these devices, an n type wafer having a resistivity of 70 Ω.cm was used, and the overall thickness of the device after fabrication was controlled to 180 μm. The p base regions 4, 5 were formed through implantation of boron ions and thermal diffusion, under the conditions as follows: the dose amount was $1.0 \times 10^{14}$ cm$^{-2}$, and the diffusion temperature and time were 1150° C. and 5 hours, respectively. The thickness of the gate oxide film 8 was 0.1 μm. The p collector region 1 was also formed though implantation of boron ions and thermal diffusion, with the dose amount of boron being controlled to $3.0 \times 10^{12}$ cm$^{-2}$. For the device of the present invention, lifetime control was not particularly conducted for reducing the turn-off time.

Figure 8:
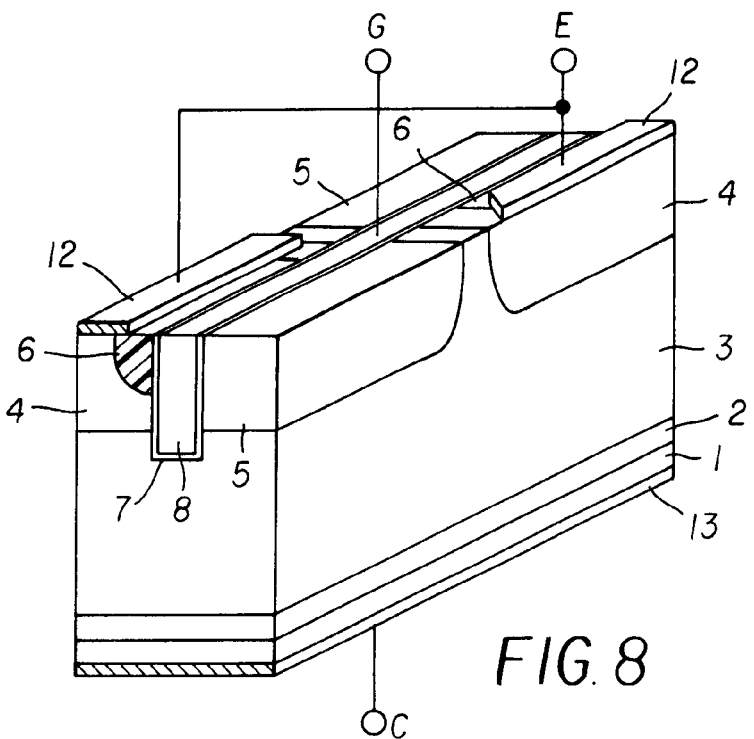
FIG. 8 is a perspective view showing cross sections of a semiconductor device according to the second embodiment of the present invention.

FIG. 8 is a perspective view showing cross sections of a principal part of a semiconductor device according to the second embodiment of the present invention. The device of FIG. 8 is different from that of FIG. 1 in that an n buffer region 2 is provided between the p collector region 1 and the n base region 3. The impurity concentration of the n buffer region 2 is controlled to be higher than that of the n base region 3. The n buffer region 2 is formed by implanting phosphorous ions, and then diffusing the implanted ions at an elevated temperature. In the present embodiment, the dose amount of phosphorous ions is $1.0 \times 10^{13}$ cm$^{-2}$, and the diffusion temperature and diffusion time are 1150° C. and four hours, respectively. The dose amount of boron ions of the p collector region is $1.0 \times 10^{14}$ cm$^{-2}$, and the diffusion temperature and diffusion time are 1150° C. and two hours, respectively. The device of the present embodiment is subjected to lifetime control utilizing proton irradiation. The breakdown voltage of the device is 3300V, and the n base region 3 has a resistivity of 250 Ω.cm, and a width of 400 μm.

Figure 9:
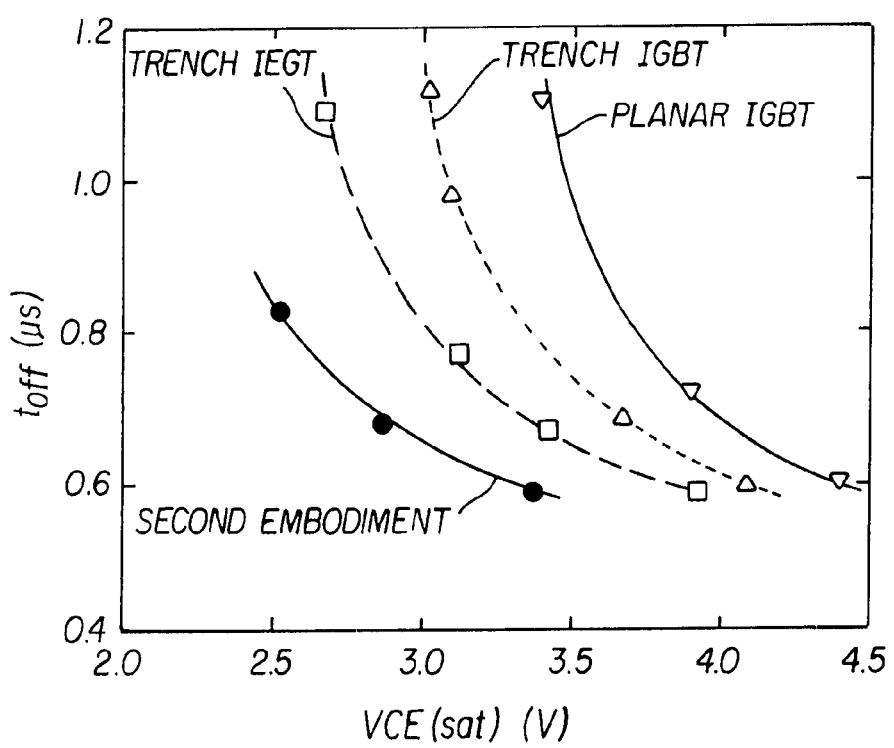
FIG. 9 is a graph showing the tradeoff between the turn-off time and the saturation voltage of the device of the second embodiment and conventional devices.
Figure 10:
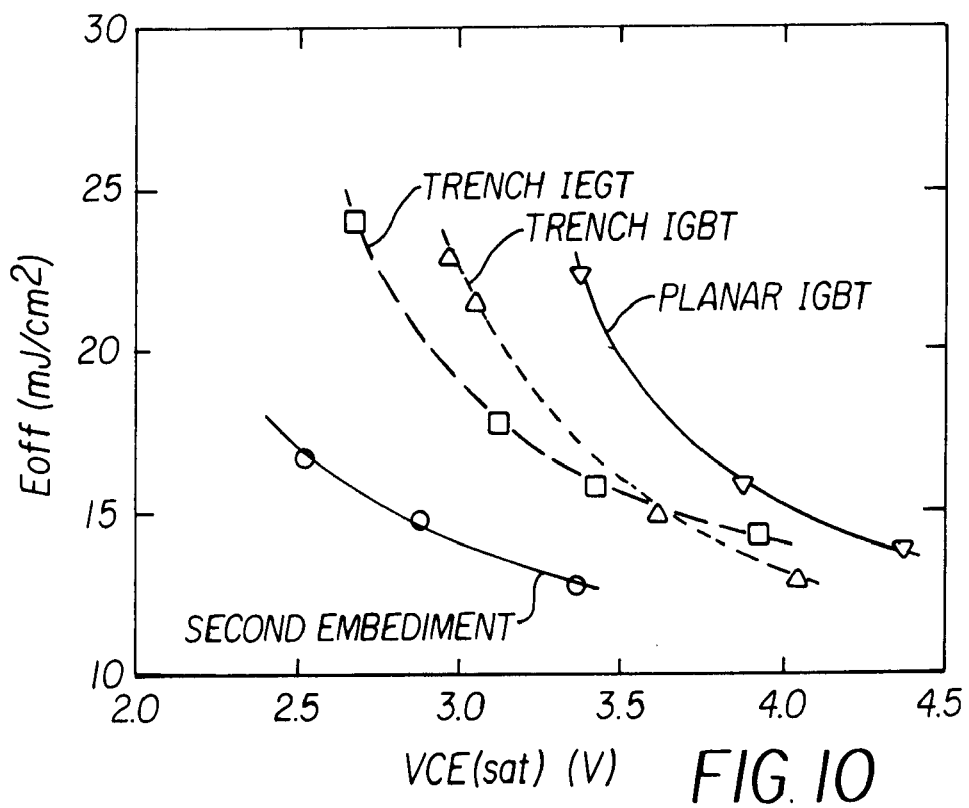
FIG. 10 is a graph showing the tradeoff between the turn-off loss and the saturation voltage of the device of the second embodiment and conventional devices.

FIG. 9 and FIG. 10 show the tradeoff between the turn-off time and the saturation time, and the tradeoff between the turnoff loss and the saturation time, respectively, with respect to the device of the second embodiment and the conventional devices as described above. It will be understood from FIGS. 9 and 10 that the device of the second embodiment exhibits better tradeoff characteristics than the conventional devices.

Figure 11:
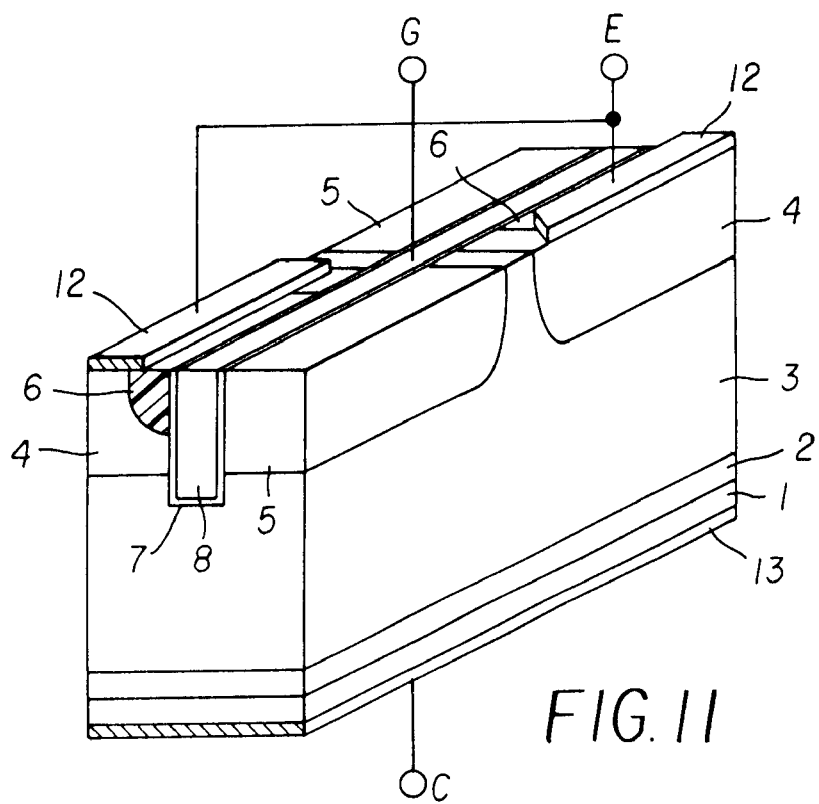
FIG. 11 is a perspective view showing cross sections of a principal part of a semiconductor device according to the third embodiment of the present invention.

FIG. 11 is a perspective view showing cross sections of a principal part of a semiconductor device according to the third embodiment of the present invention. The device of the present embodiment having a medium breakdown voltage of 600V is fabricated using an epitaxial wafer. The structure of the device is similar to that of FIG. 8, but the p collector region 1 of the present device has a far larger thickness and an increased impurity concentration because of the use of the epitaxial wafer. The p collector region 1 also serves as a support substrate. The p collector region 1 has a p substrate of the epitaxial wafer has a resistivity of 0.002 Ω.cm, and a thickness of 350 μm. An n buffer region 2 having a resistivity of 0.1 Ω.cm and a thickness of 10 μm is grown on the p collector region 1, and an n base region 3 having a resistivity of 40 Ω.m and a thickness of 60 μm is grown on the n buffer region 2, to thus provide an epitaxial wafer. The first p base region 4, second p base region 5, n emitter region 6, gate electrode portion, emitter electrode 12 and the collector electrode 13 are subsequently formed in the same manner as in the case of FIG. 1.

Figure 12:
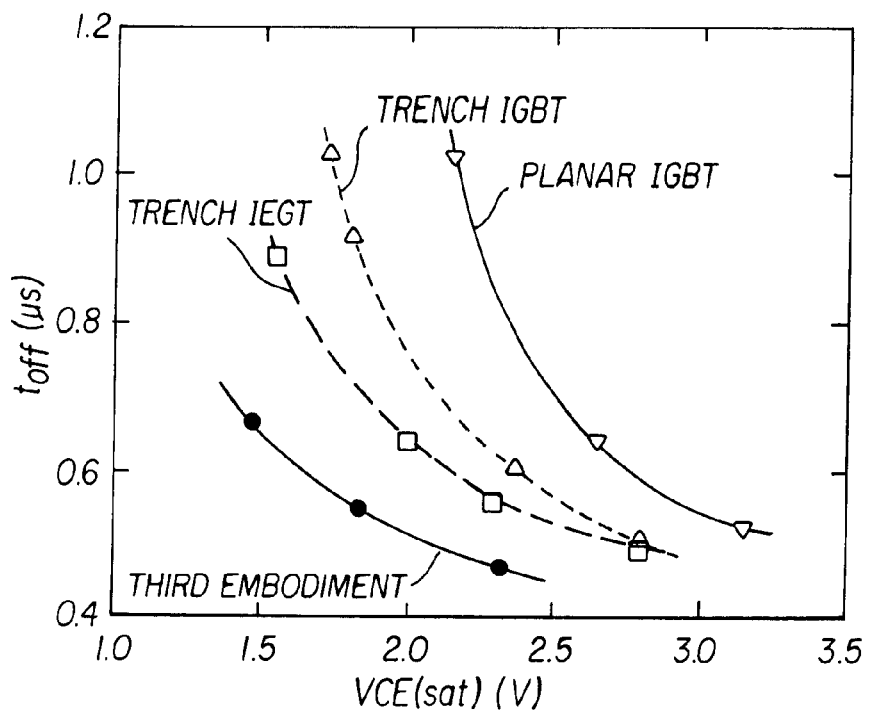
FIG. 12 is a graph showing the tradeoff between the turn-off time and the saturation voltage of the device of the third embodiment and conventional devices.
Figure 13:
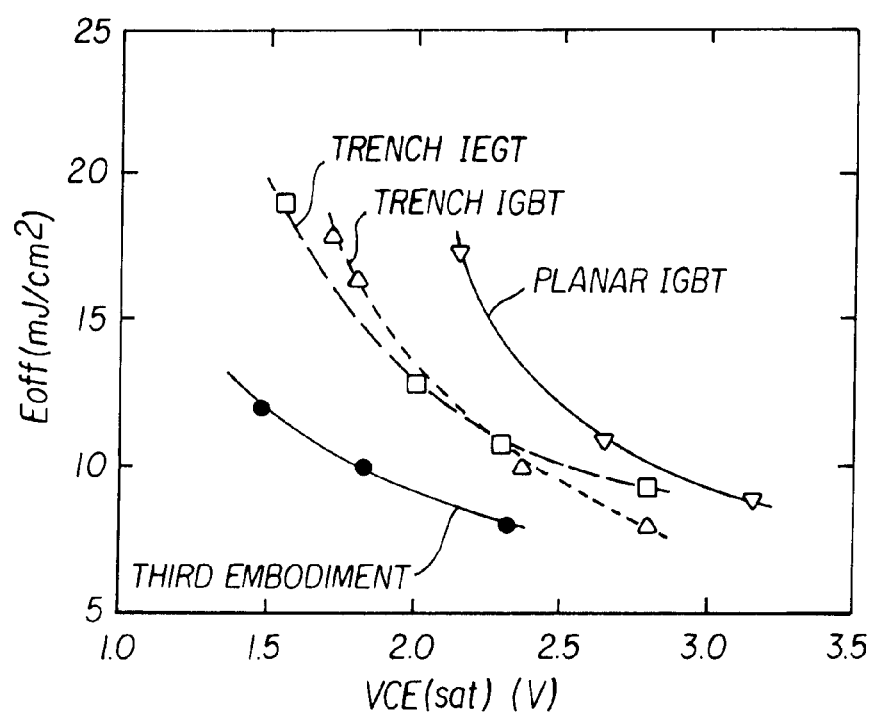
FIG. 13 is a graph showing the tradeoff between the turn-off loss and the saturation voltage of the device of the third embodiment and conventional devices.

FIG. 12 and FIG. 13 show the tradeoff between the turn-off time and the saturation voltage and the tradeoff between the turn-off loss and the saturation voltage, respectively, with respect to the device of the third embodiment of the invention and the conventional devices. The device of the third embodiment exhibits more excellent tradeoff characteristics as compared with the conventional devices.

Figure 14:
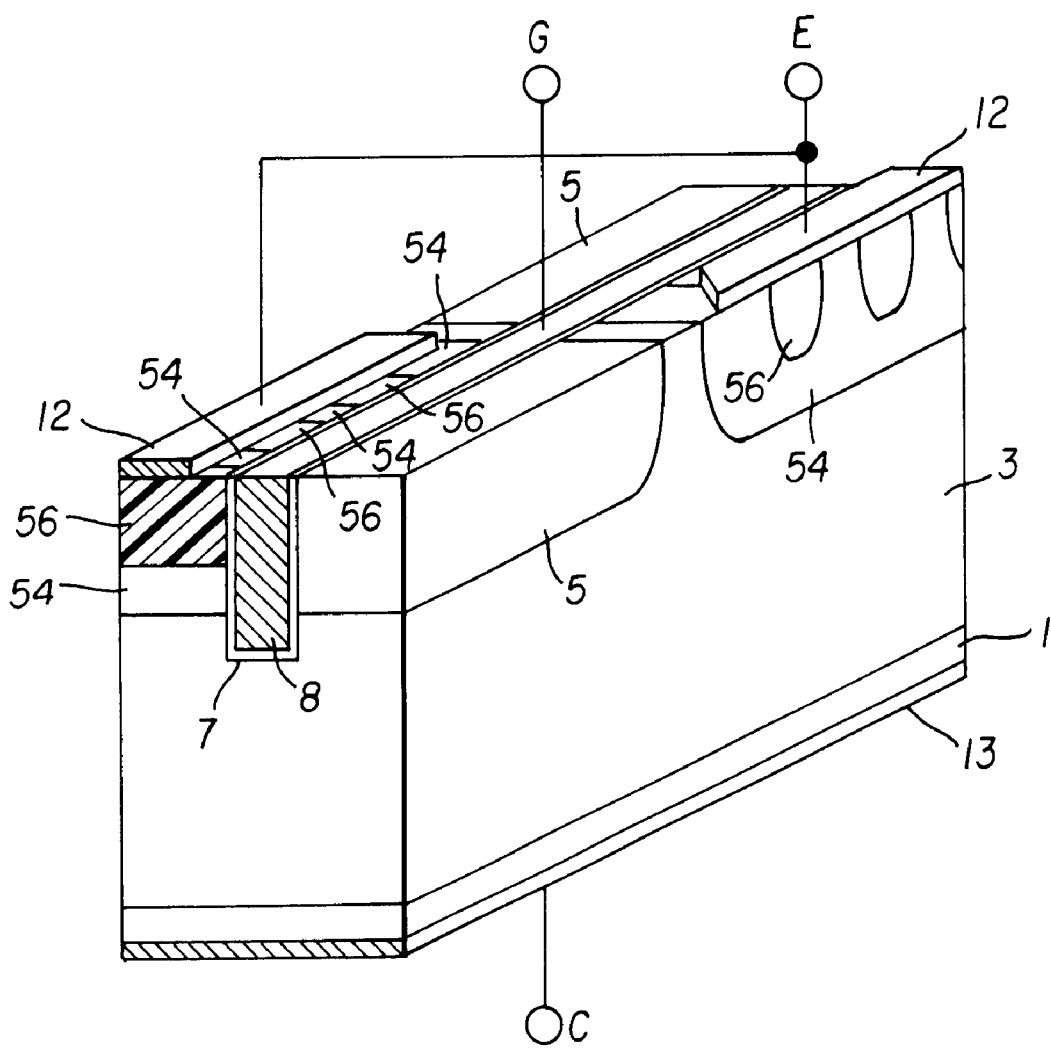
FIG. 14 is a perspective view showing cross sections of a principal part of a semiconductor device according to the fourth embodiment of the present invention.

FIG. 14 is a perspective view showing cross sections of a principal part of a semiconductor device constructed according to the fourth embodiment of the present invention.

The embodiment of FIG. 14 is different from that of FIG. 1 in that first p base regions 54 and n emitter regions 56 are arranged alternately in the Z-axis direction as viewed from the surface of the device. The emitter electrode 12 is formed in contact with the surfaces of the first p base regions 54 and the n emitter regions 56. Thus, the area of the n emitter regions 56 that appear on the surface of the device is increased, so that the n emitter regions 56 and the emitter electrode 12 are surely held in contact with each other even in a fine device structure. The other effects of the present embodiment are the same as those of the first embodiment. Also, p$^+$regions may be formed in surface layers of the first p base regions 54 and the second p base regions 5.

Figure 15A:
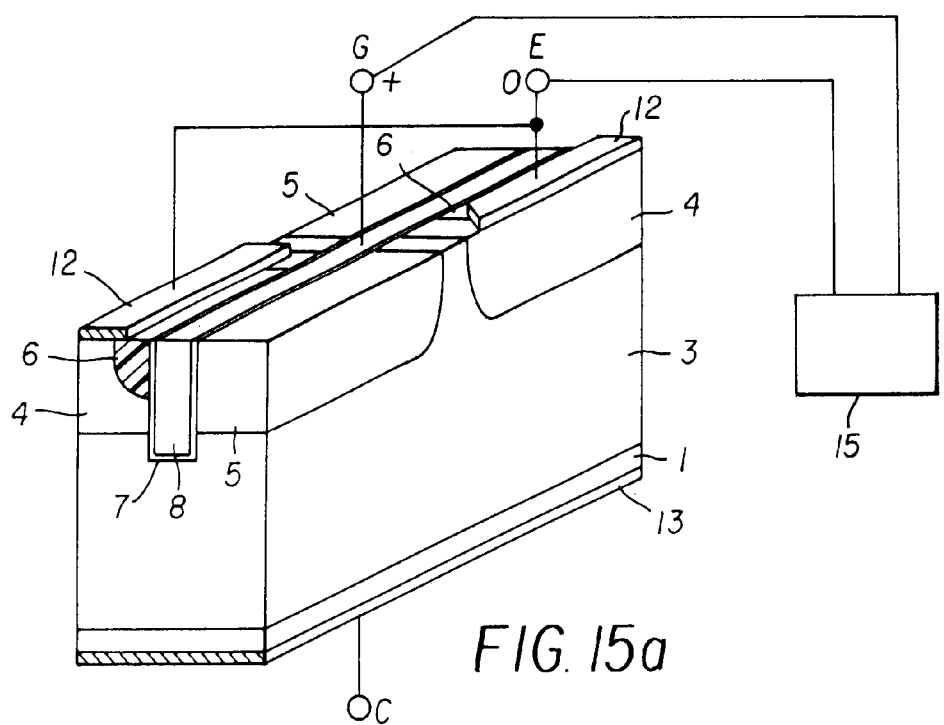
FIG. 15(a) is a view showing a method of turning on the device according to the fifth embodiment of the present invention.
Figure 15B:
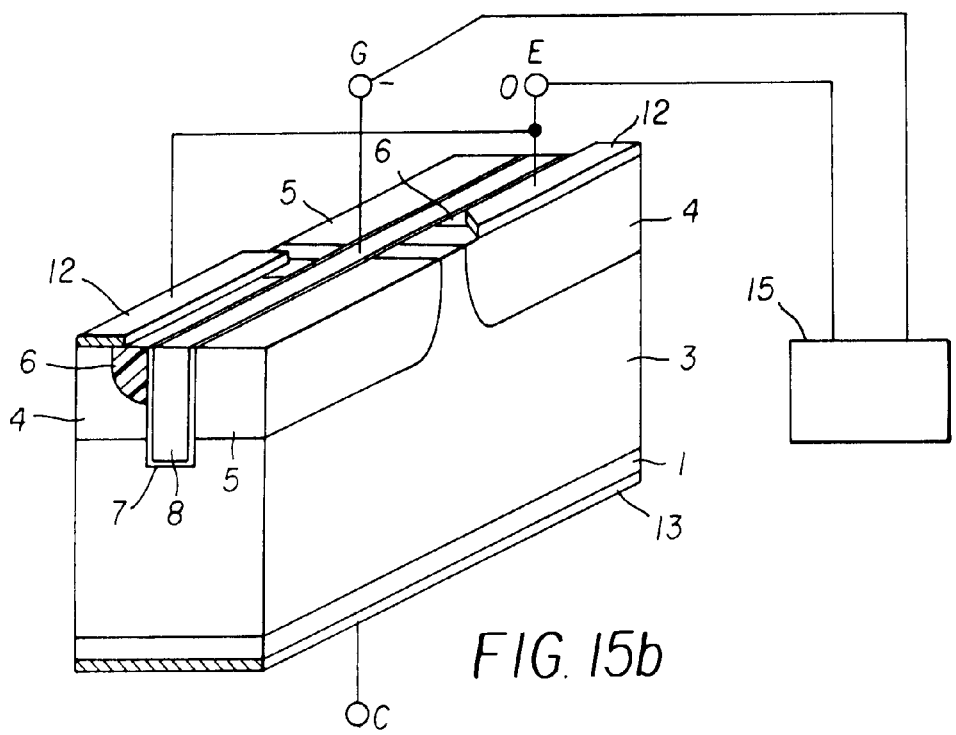
FIG. 15(b) is a view showing a method of turning off the device.

FIGS. 15(a) and 15(b) show methods of driving the semiconductor device of the present invention according to the fifth embodiment of the present invention, wherein FIG. 15(a) is useful in explaining a method of turning on the device, while FIG. 15(b) is useful in explaining a method of turning off the device. Initially, the gate terminal G and the emitter terminal E of the device of the present invention are connected to a gate drive device 15. A forward-bias voltage is applied to between the emitter terminal E and the collector terminal C, and the gate drive device 15 operates to give a positive potential to the gate terminal E and zero potential to the emitter terminal E so that the terminal E is grounded. As a result, an n channel is formed in the first p base region 4, and the device is turned on.

Subsequently, to turn off the device that was turned on in the above manner, the gate drive device 15 operates to give a negative potential to the gate terminal, and zero voltage to the emitter terminal E, so that a p channel is formed in the n base region 3, as described above. As a result, carriers in the vicinity of the second p base regions are drawn away, and the device is turned off.

As described above, the gate drive circuit 15 operates to apply a selected one of positive and negative voltage to the gate terminal G, to change the conductivity type of the channels formed in the device, thereby to turn on or off the device. Thus, the driving method of the present invention is characterized in that the ON/OFF control of the device is accomplished by changing the conductivity type of the channels. The device to be driven in the above manner is identical with that of FIG. 1.

According to the present invention, the first p base regions and the second p base regions are formed alternately in the Z-axis direction with certain spacing therebetween, and the second base regions are held in a floating-state in terms of the potential, so that the semiconductor device shows improved tradeoff between the saturation voltage and the turn-off characteristics, while assuring an advantageously short turn-off storage time. Also, the first base region serves as a p+region that would be provided in the trench IEGT as one type of known device, thus eliminating the need to provide the p+region, with results of an increased effective area and reduced ON resistance. Where the device of the present invention has the same ON resistance as the trench IEGT, the chip size can be reduced compared to that of the trench IEGT, and the device can be manufactured at a reduced cost.

What is claimed is:

1. A semiconductor device, comprising:
   a first-conductivity-type first base region;
   a gate electrode formed on a gate insulating film within a longitudinal groove having a bottom and two opposing sides, such that the gate electrode is formed in a selected elongate portion of a surface layer of the first base region;
   one or more second-conductivity-type second base region formed in one or more selected portion of the surface layer of the first base region, such that the second base region has a smaller depth than the groove, and is located adjacent to the groove;
   each of one or more source region formed in one of one or more selected portion of a surface layer of the second base region, to be located adjacent to the groove;
   one or more second-conductivity-type third base region that is formed in one or more selected portion of the surface layer of the first base region, apart from the second base region, to be located adjacent to the groove;
   one or more first main electrode, each of said one or more first main electrode formed in contact with one of said one or more second base region and one of said one or more source region within said one of said one or more second base region;
   a collector region formed in a rear surface layer of the first base region; and
   a second main electrode formed on the collector region;
   wherein one of said one or more second base region and one of said one or more third base region are alternately formed along at least one side of the groove in a longitudinal direction of the groove.

2. A semiconductor device according to claim 1, wherein at least one second base region and at least one third base region are formed on the opposite sides of the groove as viewed in the longitudinal direction thereof.

3. A semiconductor device according to claim 2, wherein said at least one second base region is opposed to said at least one third base region with the groove located therebetween.

4. A semiconductor device according to claim 3, further comprising:
   a first-conductivity-type fourth base region formed on the rear surface layer of the first base region, said fourth base region having smaller resistance than the first base region, said collector region being formed on the fourth base region.

5. A semiconductor device according to claim 2, further comprising:
   a first-conductivity-type fourth base region formed on the rear surface layer of the first base region, said fourth base region having smaller resistance than the first base region, said collector region being formed on the fourth base region.

6. A semiconductor device according to claim 1, further comprising:
   a first-conductivity-type fourth base region formed on the rear surface layer of the first base region, said fourth base region having smaller resistance than the first base region, said collector region being formed on the fourth base region.

7. A method of driving a semiconductor device comprising a first-conductivity-type first base region, a gate electrode formed on a gate insulating film within a longitudinal groove having a bottom and two opposing sides, such that the gate electrode is formed in a selected elongate portion of a surface layer of the first base region, one or more second-conductivity-type second base region formed in one or more selected portion of the surface layer of the first base region, such that the second base region has a smaller depth than the groove, and is located adjacent to the groove, each of one or more source region formed in one of one or more selected portion of a surface layer of the second base region, to be located adjacent to the groove, one or more second-conductivity-type third base region that is formed in one or more selected portion of the surface layer of the first base region, apart from the second base region, to be located adjacent to the groove, one or more first main electrode, each of said one or more first main electrode formed in contact with one of said one or more second base region and one of said one or more source region within said one of said one or more second base region, a collector region formed in a rear surface layer of the first base region, and a second main electrode formed on the collector region, wherein one of said one or more second base region and one of said one or more third base region are alternately formed along at least one side of the groove in a longitudinal direction of the groove, said method comprising the step of:
   driving the semiconductor device so that a channel formed between the second base region and the third base region upon turn-on has a different conductivity type than that formed upon turn-off.

8. A method of driving a semiconductor device according to claim 7,
   wherein a first-conductivity-type channel is formed in each of said one or more second base region when the device is turned on, and a second-conductivity-type channel is formed in the first base region when the device is turned off.

9. A method of driving a semiconductor device according to claim 8, wherein the polarity of a voltage applied between the gate electrode and each of said one or more first main electrode upon turn-on is reversed with respect to that of a voltage applied upon turn-off.

10. A method of driving a semiconductor device according to claim 7,
wherein the polarity of a voltage applied between the gate electrode and each of said one or more first main electrode upon turn-on is reversed with respect to that of a voltage applied upon turn-off.

* * * * *